(12) United States Patent
Thompson et al.

(10) Patent No.: US 10,571,268 B2
(45) Date of Patent: Feb. 25, 2020

(54) MEMS SENSOR WITH OFFSET ANCHOR LOAD REJECTION

(71) Applicant: InvenSense, Inc., San Jose, CA (US)

(72) Inventors: Matthew Thompson, Beaverton, OR (US); Houri Johari-Galle, San Jose, CA (US); Leonardo Baldasarre, Gavirate (IT); Sarah Nitzan, Palo Alto, CA (US); Kirt Williams, Portola Valley, CA (US)

(73) Assignee: InvenSense, Inc., San Jose, CA (US)

( * ) Notice: Subject to any disclaimer, the term of this patent is extended or adjusted under 35 U.S.C. 154(b) by 140 days.

(21) Appl. No.: 15/828,323

(22) Filed: Nov. 30, 2017

(65) Prior Publication Data

US 2019/0162538 A1    May 30, 2019

(51) Int. Cl.
| | |
|---|---|
| *G01P 15/125* | (2006.01) |
| *G01C 19/5783* | (2012.01) |
| *G01C 19/5712* | (2012.01) |
| *B81B 3/00* | (2006.01) |

(52) U.S. Cl.
CPC ........ *G01C 19/5712* (2013.01); *B81B 3/0078* (2013.01); *G01C 19/5783* (2013.01); *G01P 15/125* (2013.01); *B81B 2201/0235* (2013.01); *B81B 2201/0242* (2013.01)

(58) Field of Classification Search
CPC ............... G01P 15/125; G01C 19/5783; B81B 2201/0235; B81B 2201/0242
USPC ....................................................... 73/514.32
See application file for complete search history.

(56) References Cited

U.S. PATENT DOCUMENTS

| | | | |
|---|---|---|---|
| 8,056,415 B2 | 11/2011 | McNeil | |
| 9,638,712 B2 | 5/2017 | Tang | |
| 2010/0223997 A1 | 9/2010 | Geisberger | |
| 2012/0262026 A1 | 10/2012 | Lin | |
| 2014/0298909 A1 | 10/2014 | Simoni | |
| 2014/0298920 A1 | 10/2014 | Simini | |
| 2015/0075285 A1* | 3/2015 | Ariki .................. | G01C 19/5733 73/514.32 |

* cited by examiner

*Primary Examiner* — John E Chapman, Jr.
(74) *Attorney, Agent, or Firm* — Haley Guiliano LLP; Joshua Van Hoven; Maryam Imam (57) ABSTRACT

A MEMS sensor includes a MEMS layer, a cap layer, and a substrate layer. The MEMS layer includes a suspended spring-mass system that moves in response to a sensed inertial force. The suspended spring-mass system is suspended from one or more anchors. The anchors are coupled to each of the cap layer and the substrate layer by anchoring components. The anchoring components are offset such that a force applied to the cap layer or the substrate layer causes a rotation of the anchor and such that the suspended spring-mass system substantially remains within the original MEMS layer.

20 Claims, 6 Drawing Sheets

MEMS SENSOR WITH OFFSET ANCHOR LOAD REJECTION

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), and magnetic field. The operation of these forces on the movable proof masses may be measured based on the movement of the proof masses in response to the forces. In some implementations, this movement is measured based on distance between the movable proof masses and sense electrodes, which form capacitors for sensing the movement.

A MEMS sensor may be constructed of multiple layers that are bonded together, such as a cap layer, a MEMS layer, and a substrate layer. The movable MEMS components of the MEMS sensor may be located within the MEMS layer and anchored to one or both of the cap layer and the substrate layer. If the location of the MEMS components relative to sense electrodes is different than an expected location, the capacitance that is used to determine the inertial force may be incorrect. Deviation from an expected location of MEMS components may result from a variety of circumstances such as manufacturing tolerances, manufacturing errors, packaging with other components, or stresses experienced during sensor operation.

SUMMARY OF THE INVENTION

In an embodiment of the present disclosure, an exemplary microelectromechanical (MEMS) device comprises an anchor system bonded to a cap layer and bonded to a substrate layer, a proof mass coupled to the anchor system via a spring, and a sense element coupled between the proof mass and the substrate layer wherein the sense element outputs a signal in response to motion of the proof mass in a first direction. In an embodiment, a force applied to the anchor system causes the anchor system and the spring to move in the first direction, and the proof mass remains substantially stationary when the first force is applied to the anchor system.

In an embodiment of the present disclosure, an exemplary microelectromechanical (MEMS) device comprises a cap including a first anchoring system, a substrate including a second anchoring system, wherein at least one sense electrode is located on a surface of the substrate, and a MEMS layer bonded to each of the cap and the substrate to define a cavity, wherein the MEMS layer comprises a suspended spring-mass system. In an embodiment, the suspended spring-mass system comprises at least one movable mass, wherein at least a portion of the at least one movable mass is located at a first distance from to the at least one sense electrode to form at least one sense capacitor, and at least one anchoring mass coupled to the at least one movable mass to suspend the at least one movable mass within the MEMS layer, wherein the at least one anchoring mass is coupled to at least a portion of the first anchoring system and at least a portion of the second anchoring system, and wherein in response to a force in a direction perpendicular to the MEMS layer the first anchoring system and the second anchoring system cause the at least one anchoring mass to move in the direction of the force and the at least one movable mass to remains at the first distance from the at least one sense electrode to form the at least one sense capacitor.

In an embodiment of the present disclosure, an exemplary microelectromechanical (MEMS) device comprises a cap, a substrate wherein at least one sense electrode is located on a surface of the substrate, and a MEMS layer bonded to each of the cap and the substrate to define a cavity, wherein the MEMS layer comprises a suspended spring-mass system. In an embodiment, the MEMS device further comprises at least one post coupled to the cap and one or more anchoring masses of the suspended spring-mass system, and at least one standoff coupled to the cap and the one or more anchoring masses of the suspended spring mass system, wherein the at least one standoff is offset from the at least one post such that the at least one standoff and at least one post do not overlap on opposite faces of the one or more anchoring masses, and wherein in response to a force perpendicular to the MEMS layer the one or more anchoring masses move in the direction of the force and at least one proof mass of the spring mass system is substantially stationary.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

An inertial sensor is designed and manufactured as a microelectromechanical (MEMS) accelerometer. A MEMS layer is formed using semiconductor processing techniques to include the mechanical components of the sensor and electrical connections to other components of the MEMS accelerometer, such as CMOS circuitry located within the sensor die (e.g., a CMOS layer that also functions as a substrate or cap layer) or external to the sensor die. The MEMS layer is hermetically sealed within other semiconductor layers, such as an underlying substrate layer and a cap layer.

The MEMS layer includes a suspended spring-mass system in which one or more proof masses are suspended within the MEMS layer by springs. The movement of the proof masses is restricted by the springs, and in some embodiments, additional components such as masses and levers. These springs and additional components collectively facilitate the motion of the proof masses along one or more axes that are used for sensing linear acceleration. Sense electrodes are located adjacent to each proof mass (or in some embodiments, additional sense masses) in the direction of the sensed linear acceleration, forming a capacitor that changes based on the distance between the proof masses and sense electrodes. In an exemplary z-axis accelerometer, the sense electrodes are located on another layer parallel to the proof masses.

The suspended spring-mass system is suspended from an anchor, which in turn is fixed to one or both of the cap layer and substrate layer such that the anchor does not move in response to the sensed inertial forces. In an embodiment of the present disclosure, the anchor includes two anchoring masses within the MEMS layer. Each of the anchoring masses is bonded to both the cap layer and the substrate layer by respective anchoring components. The bonds of the anchoring masses to the anchoring components are offset (e.g., the bonds from the anchoring masses to the substrate anchoring components are offset from the bonds of the anchoring masses to the cap anchoring components), such that at least 75% of the bonds are non-overlapping.

Forces may be placed on the cap layer and/or substrate layer in a variety of circumstances, such as a due to the manufacturing of the MEMS inertial sensor, assembly with other components in a device, and end use applications. Forces that are distributed from the cap or substrate to the anchoring masses (e.g., via the anchoring components) cause a rotation of the anchoring masses, due to the offset of the bonds of the anchoring masses to the anchoring components. This results in a rotational displacement of the anchoring masses in the direction of the force and a countervailing displacement of the suspended spring-mass system in the opposite direction. As a result, the suspended spring-mass system remains substantially aligned within the MEMS layer, with less than a 5% angle with the planes of the original MEMS layer location.

Figure 1:
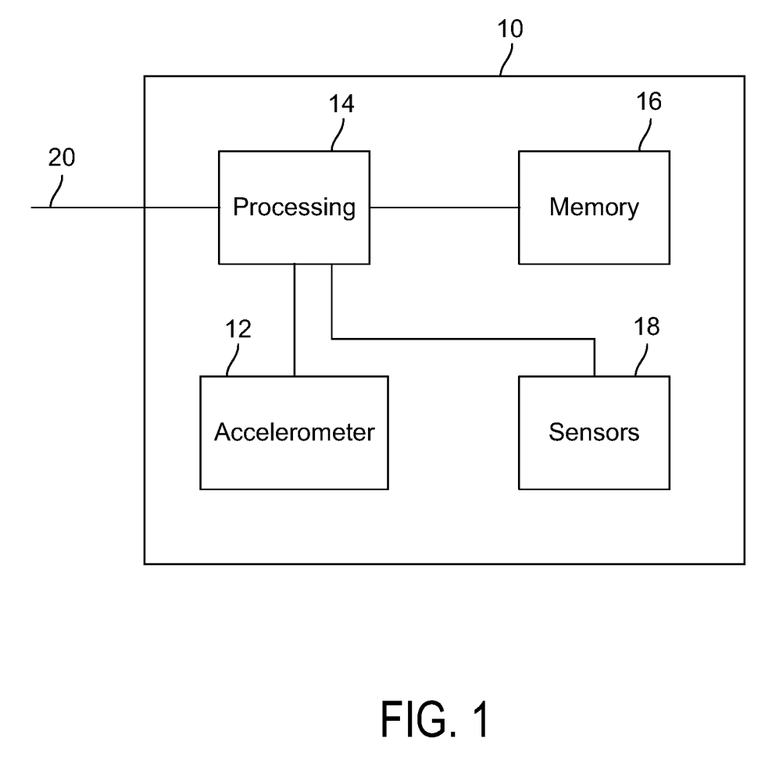
FIG. 1 shows an illustrative motion sensing system in accordance with an embodiment of the present disclosure.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS inertial sensor 12 (e.g., a single or multi-axis accelerometer, a single or multi-axis gyroscope, or combination thereof) and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS inertial sensor 12 or other sensors 18, or on an adjacent portion of a chip to the MEMS inertial sensor 12 or other sensors 18) to control the operation of the MEMS inertial sensor 12 or other sensor 18 and perform aspects of processing for the MEMS inertial sensor 12 or other sensor 18. In some embodiments, the MEMS inertial sensor 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS inertial sensor 12 by interacting with the hardware control logic, and process signals received from MEMS inertial sensor 12. The microprocessor may interact with other sensors in a similar manner.

Although in some embodiments (not depicted in FIG. 1), the MEMS inertial sensor 12 or other sensors 18 may communicate directly with external circuitry (e.g., via a serial bus or direct connection to sensor outputs and control inputs), in an embodiment the processing circuitry 14 may process data received from the MEMS inertial sensor 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the MEMS inertial sensor 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS inertial sensors 12 and other sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS inertial sensor (e.g., MEMS inertial sensor 12) may include one or more movable proof masses that are configured in a manner that permits the MEMS inertial sensor (e.g., a MEMS accelerometer or MEMS gyroscope) to measure a desired force (e.g., linear acceleration, angular velocity, magnetic field, etc.) along an axis. In some embodiments, the one or more movable proof masses may be suspended from anchoring points, which may refer to any portion of the MEMS sensor which is fixed, such as an anchor that attaches to a substrate layer (e.g., a CMOS layer) that is parallel to the MEMS layer of the device, a cap layer that is parallel to the MEMS layer, a frame of the MEMS layer of the device, or any other suitable portion of the MEMS device that is fixed relative to the movable proof masses. The proof masses may be arranged in a manner such that they move in response to measured force. The movement of the proof masses relative to a fixed surface (e.g., a fixed sense electrode extending into the MEMS layer or located parallel to the movable mass on the substrate) in response to the measured force is measured and scaled to determine the desired inertial parameter.

MEMS inertial sensors are utilized in a variety of application in a wide range of end use environments, ranging from wearable and Internet of Things (IoT) devices in consumer applications to vehicle and industrial environments. A particular MEMS inertial sensor package may be utilized in hundreds or even thousands of different end-use devices, each device having its own unique assembly and packaging with other device components and unique end-use applications. Many of these devices are miniaturized and require the MEMS inertial sensor package to be assembled in close proximity to other components or in a manner that will subject the MEMS inertial sensor to external stresses. Accordingly, the MEMS inertial sensor package may be subject to a variety of forces as a result of manufacturing, assembly, and end-use applications. In some embodiments these forces may be imparted on the cap or substrate layer of the sensor, and through connections to one or both of those layers, to the MEMS device layer. If these forces cause a shift in location of certain MEMS layer components (e.g., proof masses that form capacitors with sense electrodes) the accuracy and sensitivity of the MEMS inertial sensor may be negatively impacted.

Figure 2:
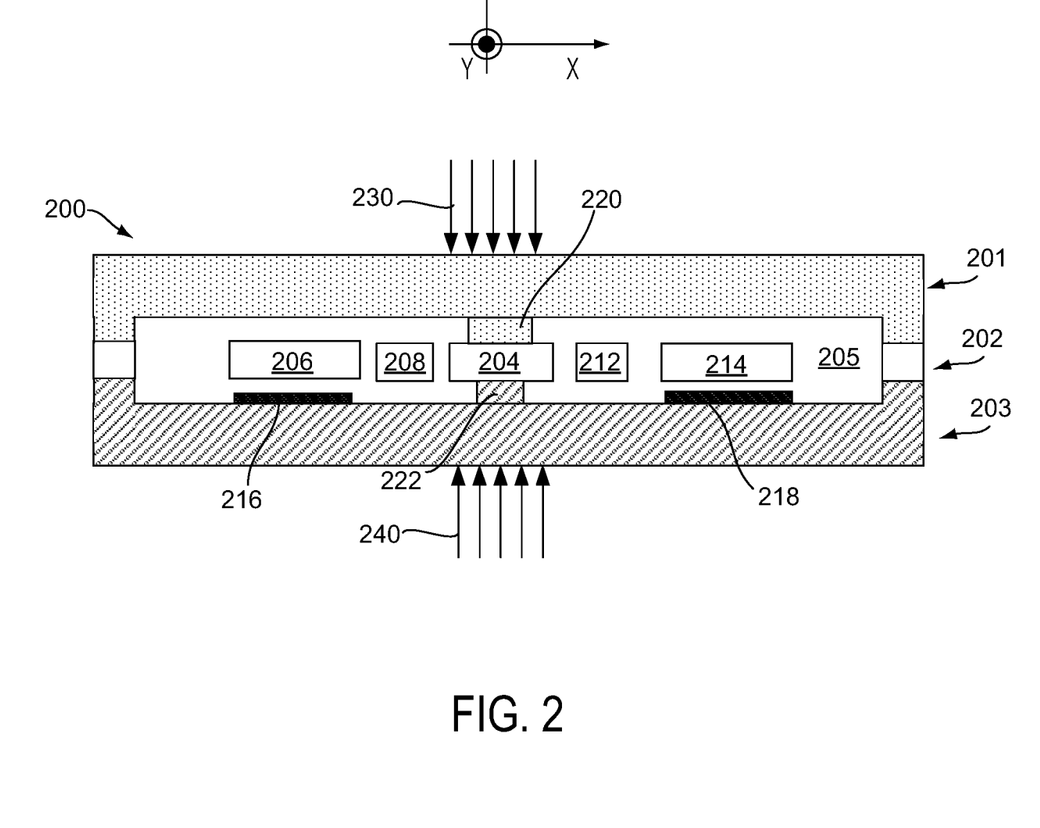
FIG. 2 shows an illustrative MEMS sensor in accordance with an embodiment of the present disclosure.

FIG. 2 shows an illustrative MEMS inertial sensor 200 in accordance with an embodiment of the present disclosure. In an embodiment, MEMS inertial sensor 200 includes a cap layer 201, a MEMS layer 202, and a substrate layer 203. During a manufacturing process for the MEMS inertial sensor 200 semiconductor manufacturing techniques may be used to produce the functional components of each of these layers, such as a suspended spring-mass system of the MEMS layer 202, posts of the cap layer 201, and standoffs, electrodes, and processing circuitry of the substrate layer 203. The MEMS layer 202 may be bonded to each of the cap layer 201 and substrate layer 202, forming a cavity 205.

Functional components of the MEMS inertial sensor 200 may be located within cavity 205, and in an exemplary embodiment may include anchoring mass 204, springs 208 and 212, proof masses 206 and 214, sense electrodes 216 and 218, post 220, and standoff 222. Anchoring mass 204, springs 208 and 212, and proof masses 206 and 214 may be formed within the MEMS layer 202. In an exemplary embodiment, anchoring mass 204 may be bonded to a post 220 of cap layer 201 and to a standoff of substrate layer 203, such that the location of anchoring mass 204 is fixed during operation of MEMS inertial sensor. Springs 208 and 212 may be coupled to anchoring mass 204 (coupling not shown in cross section of FIG. 2) and may also be coupled to proof masses 206 and 214 (coupling not shown in cross section of FIG. 2). The springs 208 and 212 and the proof masses 206 and 214 may collectively be referred to as a suspended spring-mass system, and in the exemplary embodiment of FIG. 2, are suspended from anchoring mass 204.

Although sense electrodes may be located at a variety of locations (e.g., in-plane, out-of-plane, etc.) for a variety of purposes (sense electrodes, compensation electrodes, drive electrodes, etc.), in the exemplary embodiment of FIG. 2 sense electrodes 216 and 218 are located on the surface of substrate layer 203. Sense electrode 216 is located adjacent and parallel to proof mass 206 and forms a first capacitor therewith, while sense electrode 218 is located adjacent and parallel to proof mass 214 and forms a first capacitor therewith. The capacitance for each of the first capacitor and the second capacitor is based on the distance between the respective sense electrodes and proof masses. If this distance changes, the absolute value of the measured capacitance may not correspond to the actual inertial force, or a change in measured capacitance may be proportionally smaller (e.g., if the distance between the proof mass and the sense electrode increases, changes in distance due to inertial force will result in a proportionally smaller change in capacitance) or proportionally larger (e.g., if the distance between the proof mass and the sense electrode decreases, changes in distance due to inertial force will result in a proportionally larger change in capacitance).

As described herein, the MEMS inertial sensor package may be subject to a variety of forces as a result of manufacturing, assembly, and end-use applications. In some embodiments these forces may be imparted on the cap or substrate layer of the sensor (e.g., as cap force 230 and/or substrate force 240) and through connections to one or both of those layers, to the MEMS device layer. If these forces cause a shift in location of certain MEMS layer components (e.g., proof masses that form capacitors with sense electrodes) the accuracy and sensitivity of the MEMS inertial sensor may be negatively impacted.

Figure 3A:
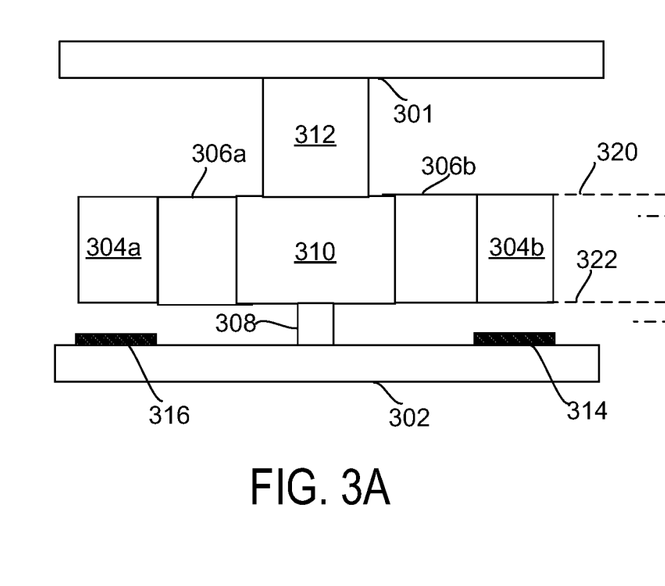
FIG. 3A shows a cross section of components of an illustrative MEMS sensor having a vertically-stacked anchor in accordance with some embodiments of the present disclosure.
Figure 3B:
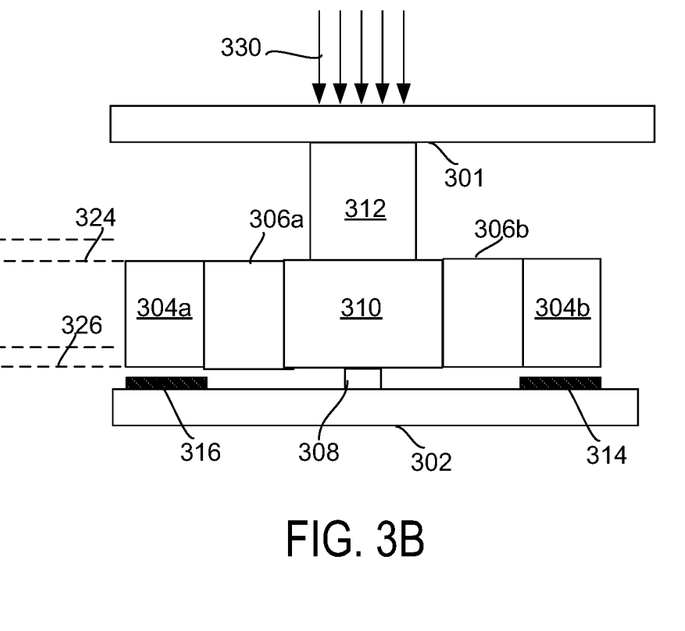
FIG. 3B shows a cross section of components of an illustrative MEMS sensor having a vertically-stacked anchor experiencing a vertical compressive force in accordance with some embodiments of the present disclosure.
Figure 4:
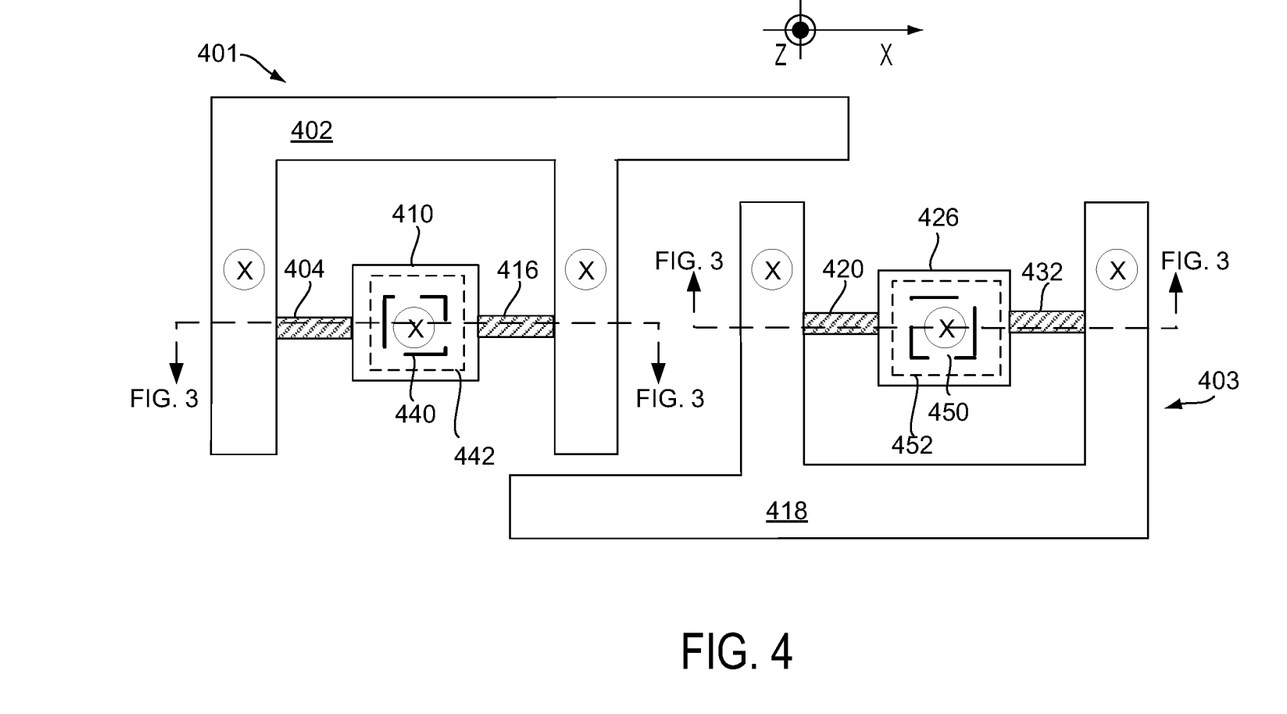
FIG. 4 shows an illustrative MEMS layer of a MEMS accelerometer having a vertically-stacked anchor experiencing a vertical compressive force in accordance with some embodiments of the present disclosure.

FIG. 3A shows a cross section of components of an illustrative MEMS sensor having a vertically-stacked anchor in accordance with some embodiments of the present disclosure where the top view is shown in section view in FIG. 4. In the exemplary cross-section depicted in FIG. 3A, certain portions of the MEMS sensor (e.g., bonded sidewalls, portions of the suspended spring-mass system, etc.) are omitted for ease of illustration. In the exemplary embodiment depicted in FIG. 3A, a MEMS layer includes a first proof mass 304a, a first spring 306a, an anchoring mass 310, a second spring 306b, and a second proof mass 304b. First spring 306a couples first proof mass 304a to anchoring mass 310 and second spring 306b couples second proof mass 304b to anchoring mass 310. Although not shown in the cross-sectional views of FIGS. 3A and 3B, in an exemplary embodiment the first proof mass 304a is coupled to the second proof mass 304b.

A cap layer 301 is located above the MEMS layer and a substrate layer 302 is located below the MEMS layer. An upper x-y planar surface of the MEMS layer faces a lower x-y planar surface of the cap layer 301 while a lower x-y planar surface of the MEMS layer faces an upper x-y planar surface of the substrate layer 302. Sense electrodes 314 and 316 are located on the upper x-y planar surface of substrate 302. Sense electrode 316 forms a capacitor with proof mass 304a and sense electrode 314 forms a capacitor with proof mass 304b.

An anchoring component 312 (e.g., a post) extends between the cap 301 and the anchoring mass 310, forming a bonded surface on a portion of the upper x-y planar surface of anchoring mass 310. Another anchoring component 308

(e.g., a standoff) extends between the substrate 302 and the anchoring mass 310, forming a bonded surface on a portion of the lower x-y planar surface of anchoring mass 310. In the embodiment of FIG. 3A, the post 312 and the standoff 308 are substantially aligned within the x-y plane, such that a center axis of the post 312 passes through the standoff 308 and a center axis of the standoff 308 passes through the post 312. In the exemplary embodiment of FIG. 3A, the post 312 and the standoff 308 may be substantially aligned such that the bonding surface of the anchoring mass 310 to the post 312 entirely overlaps the bonding surface of the anchoring mass 310 to the standoff 308. In other embodiments the overlap of the bonding surfaces may not be complete (e.g., post and standoff that are partially offset but mostly overlapping, post and standoff that overlap at a center point but primarily extend in different (e.g., x-axis and y-axis) but may be sufficient such that a z-axis force applied to either the post or the standoff is experienced by the other component as a force normal to the bonding plane with the anchoring mass.

FIG. 3B shows a cross section of components of an illustrative MEMS sensor having a vertically-stacked anchor experiencing a vertical force in accordance with some embodiments of the present disclosure. As described herein, a MEMS sensor may experience a force on the cap or substrate of the sensor for a variety of reasons, such as during manufacturing, assembly with other components in an end device, or during use. In some instances (e.g., as a result of manufacture or assembly) these forces may be permanent during the useful life of the MEMS sensor. In the exemplary embodiment of FIG. 3B, the MEMS sensor of FIG. 3A experiences a negative z-axis force 330 on the cap layer 301.

In the exemplary embodiment of FIG. 3B, the force 330 is distributed from the cap layer to the post 312 (as well as to other components such as sidewalls of the MEMS sensor, not depicted in FIG. 3A). Because the anchoring mass 310 and standoff are directly vertically bonded, the same force that is distributed to the post 312 is also distributed to the anchoring mass 310 and standoff 308, and through these components, to the substrate 308. In some embodiments, the force 330 may be sufficient such that the anchoring mass 310 (as well as the post 312 and cap 301) experiences a negative z-direction displacement relative to the substrate 302. Although this displacement may occur in a variety of manners, in the exemplary embodiment of FIG. 3B the compressive force applied to the standoff 308 (e.g., due to the force 330 and the countervailing force applied by substrate 308) may be sufficient to cause a physical compression of standoff 308. In the embodiment of FIG. 3B, and negative z-axis displacement of the anchoring may also be experienced by the suspended spring-mass system connected thereto (e.g., proof masses 304a and 304b, and springs 306a and 306b).

The z-axis displacement of the MEMS layer components as a result of force 330 is depicted in FIGS. 3A and 3B by initial upper MEMS plane 320, initial lower MEMS plane 322, displaced upper MEMS plane 324, and displaced lower MEMS plane 326. As can be seen from a comparison of these planes, the entire MEMS plane has been displaced in the negative z-direction towards the substrate 302 and sense electrodes 314 and 316. As a result of this displacement, the capacitors of FIG. 3B may have a higher capacitance in than the capacitors of FIG. 3A, whether or not a measured external force is being sensed by the MEMS sensor. Further, the capacitors of FIG. 3B may have a higher sensitivity and lower resolution than the capacitors of FIG. 3A.

FIG. 4 shows an illustrative MEMS layer of an out-of-plane sensing MEMS accelerometer having a vertically-stacked anchor experiencing a vertical compressive force in accordance with some embodiments of the present disclosure. FIG. 4 depicts particular components in a particular configuration and having particular properties. It will be understood by a person having ordinary skill in the art that FIG. 4 may be modified in a variety of manners in accordance with the present disclosure. The components of FIG. 4 are formed within a MEMS device layer and include two parallel MEMS device planes on opposite sides of the MEMS device layer forming parallel x-y planes. Although not depicted in FIG. 4, a substrate layer may be located parallel and below the lower MEMS device plane in the negative z-direction while a cap layer may be located parallel and above to the upper MEMS device plane in the positive z-direction.

In some embodiments, the accelerometer of FIG. 4 may include a first sensor portion 401 and a second sensor portion 403, each of which includes similar or identical components. The first sensor portion and second sensor portion are oriented such that a center of mass associated with the proof mass 402 (i.e., of first sensor portion 401) and proof mass 418 (i.e., of second sensor portion 402) cause anti-phase movement in response to a linear acceleration along the z-axis.

In an embodiment, first sensor portion 401 includes an anchoring mass 410 that may be coupled to a cap layer (not depicted) by post 442 and to a substrate layer (not depicted) by standoff 440. Post 442 may be bonded to an upper x-y plane of anchoring mass 410 while standoff 440 may be bonded to a lower x-y plane of anchoring mass 410. In the exemplary embodiment of FIG. 4, the area of the bond with the post 442 may entirely overlap the area of the bond with the standoff 440, such that the post 442, anchoring mass 410, and standoff 440 are vertically aligned with respect to forces along the z-axis.

A suspended spring-mass system may be suspended from anchoring mass 410. Anchoring mass 410 may be coupled to proof mass 402 by torsion springs 404 and 416. In the exemplary embodiment of FIG. 4, proof mass 402 may be an asymmetric proof mass. Torsion springs 404 and 416 may be substantially rigid along the x-axis, may permit limited movement along the y-axis, and may have substantial torsional compliance to facilitate rotation of the proof mass 402.

In an embodiment, second sensor portion 403 includes an anchoring mass 426 that may be coupled to a cap layer (not depicted) by post 452 and to a substrate layer (not depicted) by standoff 450. Post 452 may be bonded to an upper x-y plane of anchoring mass 426 while standoff 450 may be bonded to a lower x-y plane of anchoring mass 450. In the exemplary embodiment of FIG. 4, the area of the bond with the post 452 may entirely overlap the area of the bond with the standoff 450, such that the post 452, anchoring mass 426, and standoff 450 are vertically aligned with respect to forces along the z-axis.

A suspended spring-mass system may be suspended from anchoring mass 426. Anchoring mass 426 may be coupled to proof mass 418 by torsion springs 420 and 432. In the exemplary embodiment of FIG. 4, proof mass 418 may be an asymmetric proof mass. Torsion springs 420 and 432 may be substantially rigid along the x-axis, may permit limited movement along the y-axis, and may have substantial torsional compliance to facilitate rotation of the proof mass 418.

A linear acceleration in the positive z-direction may cause proof mass 402 to move in the negative z-direction about the rotational axis and may cause proof mass 418 to move in the negative z-direction about its rotational axis (e.g., in the embodiment of FIG. 4 wherein the torsion springs 404, 416, 420, and 432 are aligned along the x-axis, the same rotational axis for both the first sensor portion 401 and second sensor portion 403). The portion of proof mass 402 located to the positive y-direction from the torsion springs 404 and 416 may move towards the substrate and any sense electrodes located below these portions of the proof mass 402. Other portions of proof mass 402 may move away from the substrate and any sense electrodes located below these other portions of the proof mass 402. The portion of proof mass 418 located to the negative y-direction from the torsion springs 420 and 432 may move towards the substrate and any sense electrodes located below these portions of the proof mass 418. Other portions of proof mass 418 may move away from the substrate and any sense electrodes located below these other portions of the proof mass 418.

A linear acceleration in the negative z-direction may cause proof mass 402 to move in the positive z-direction about the rotational axis and may cause proof mass 418 to move in the positive z-direction about its rotational axis. The portion of proof mass 402 located to the positive y-direction from the torsion springs 404 and 416 may move away from the substrate and any sense electrodes located below these portions of the proof mass 402. Other portions of proof mass 402 may move towards the substrate and any sense electrodes located below these other portions of the proof mass 402. The portion of proof mass 418 located to the negative y-direction from the torsion springs 420 and 432 may move away from the substrate and any sense electrodes located below these portions of the proof mass 418. Other portions of proof mass 418 may move towards the substrate and any sense electrodes located below these other portions of the proof mass 418.

In the exemplary embodiment of FIG. 4, a downward force is applied to the cap layer. This force is distributed to the anchoring masses 410 and 426 via posts 442 and 452. As is depicted by the "X" in FIG. 4, this causes the location of the anchoring masses 410 and 426 to shift within the MEMS sensor to move closer to the substrate layer (e.g., based on a compressive forces applied to standoffs 440 and 450). Accordingly, proof mass 402 shifts closer to the substrate layer, changing the capacitance of any capacitors formed with sense electrodes formed on that layer. The suspended spring-mass system of proof mass 418 is suspended from anchoring mass 426 and is not suspended from any components that do not experience the z-axis deflection of the anchoring mass 426. Accordingly, proof mass 418 also shifts closer to the substrate layer, changing the capacitance of any capacitors formed with sense electrodes formed on that layer.

Figure 5A:
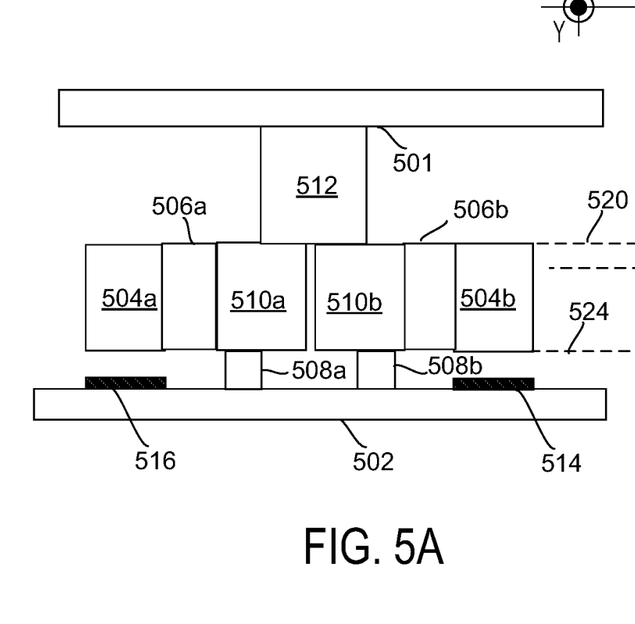
FIG. 5A shows a cross section of components of an illustrative MEMS sensor having an offset anchor in accordance with some embodiments of the present disclosure.
Figure 5B:
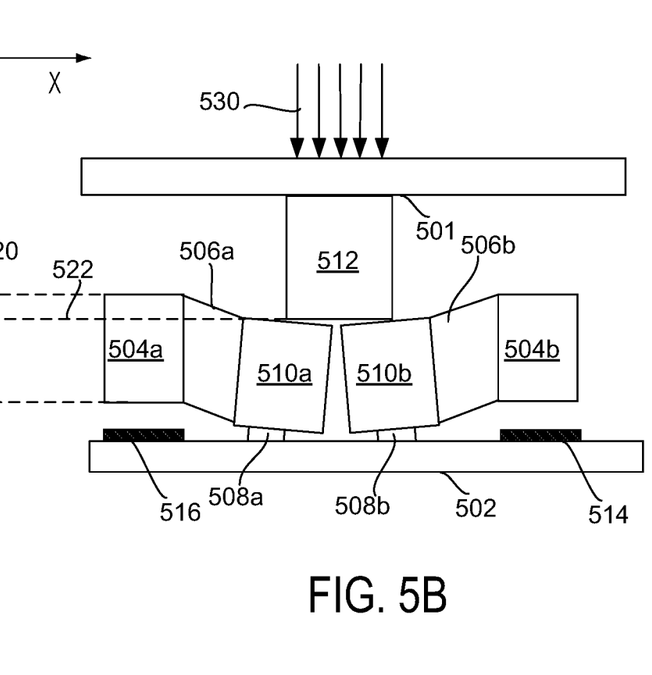
FIG. 5B shows a cross section of components of an illustrative MEMS sensor having an offset anchor experiencing a vertical compressive force in accordance with some embodiments of the present disclosure.
Figure 6:
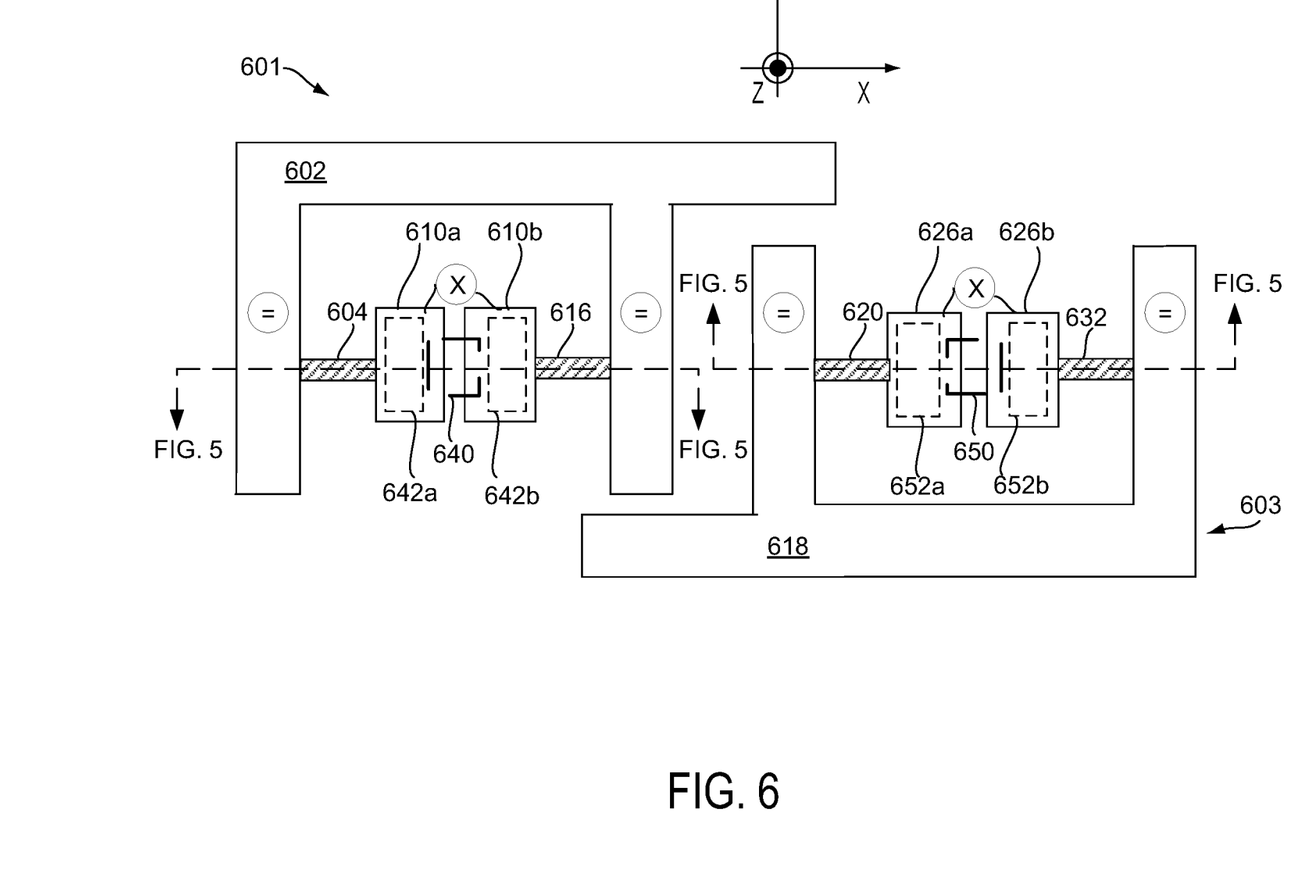
FIG. 6 shows an illustrative MEMS layer of a MEMS accelerometer having an offset anchor experiencing a vertical compressive force in accordance with some embodiments of the present disclosure.

FIG. 5A shows a cross section of components of an illustrative MEMS sensor having an offset anchor in accordance with some embodiments of the present disclosure where the top view is shown in section view in FIG. 6. In the exemplary cross-section depicted in FIG. 5A, certain portions of the MEMS sensor (e.g., bonded sidewalls, portions of the suspended spring-mass system, etc.) are omitted for ease of illustration. In the exemplary embodiment depicted in FIG. 5A, a MEMS layer includes a first proof mass 504a, a first spring 506a, a first anchoring mass 510a, a second anchoring mass 510b, a second spring 506b, and a second proof mass 504b. First spring 506b couples first proof mass 504a to first anchoring mass 510a and second spring 508a couples second proof mass 506a to second anchoring mass 510a. Although not shown in the cross-sectional views of FIGS. 5A and 5B, in an exemplary embodiment the first proof mass 504a is coupled to the second proof mass 504b.

A cap layer 501 is located above the MEMS layer and a substrate layer 502 is located below the MEMS layer. An upper x-y planar surface of the MEMS layer faces a lower x-y planar surface of the cap layer 501 while a lower x-y planar surface of the MEMS layer faces an upper x-y planar surface of the substrate layer 502. Sense electrodes 514 and 516 are located on the upper x-y planar surface of substrate 502. Sense electrode 516 forms a capacitor with proof mass 504a and sense electrode 514 forms a capacitor with proof mass 504b.

An anchoring component 512 (e.g., a post) extends between the cap 501 and each of the first anchoring mass 510a and the second anchoring mass 510b. The post 512 forms a bonded surface on a positive x-side portion of the upper x-y planar surface of anchoring mass 510a and forms a bonded surface on a negative x-side portion of the upper x-y planar surface of anchoring mass 510b. Additional anchoring components 508a and 508b (e.g., standoffs) extend between the substrate 502 and respective anchoring masses 510a and 510b. First standoff 508a forms a bonded surface on a negative x-side of the lower x-y planar surface of first anchoring mass 510a. Second standoff 508b forms a bonded surface on a positive x-side of the lower x-y planar surface of second anchoring mass 510a.

In the embodiment of FIG. 5A, the post 512 and the standoffs 508a and 508b are substantially offset within the x-y plane, such that a center axis of the post 512 does not pass through either of first standoff 508a or second standoff 508b. A center axis of first standoff 508a does not pass through post 512, and a center axis of second standoff 508a does not pass through post 512 either.

FIG. 5B shows a cross section of components of an illustrative MEMS sensor having offset anchoring experiencing a vertical force in accordance with some embodiments of the present disclosure. As described herein, a MEMS sensor may experience a force on the cap or substrate of the sensor for a variety of reasons, such as during manufacturing, assembly with other components in an end device, or during use. In some instances (e.g., as a result of manufacture or assembly) these forces may be permanent during the useful life of the MEMS sensor. In the exemplary embodiment of FIG. 5B, the MEMS sensor of FIG. 5A experiences a negative z-axis force 530 on the cap layer 501.

In the exemplary embodiment of FIG. 5B, the force 530 is distributed from the cap layer 501 to the post 512 (as well as to other components such as sidewalls of the MEMS sensor, not depicted in FIG. 5A). The post 512 is bonded to both the first anchoring mass 510a and the second anchoring mass 510b, and thus, the overall force applied to each of the anchoring masses is half of the overall force applied to the post 512. First standoff 508a is offset from post 512 and thus is also offset from the force that is applied to first anchoring mass 510a. The first anchoring mass 510a rotates towards the substrate 502 in a clockwise direction about the first standoff 508a. Second standoff 508b is similarly offset from post 512 and thus is also offset from the force that is applied to second anchoring mass 510b. The second anchoring mass 510b rotates towards the substrate in a counterclockwise direction about the second standoff 508b.

The clockwise rotation of the first anchoring mass 510a may also cause the first spring 506a and the proof mass 504a to move, while the counterclockwise rotation of the second anchoring mass 510b may also cause the second spring 506b and the proof mass 504b to move. In an exemplary embodiment, the sizing and relative location of the post 512, the anchoring masses 510a and 510b, and the standoffs 508a and 508b may be such that the springs 506a and 506b are pulled partially out-of-plane while the proof masses 504a and 504b experience a countervailing upward push to substantially remain in the original MEMS plane. The sizing and relative locations may be configured in such a way that a greater z-axis force causing a greater displacement of the anchoring masses 510a and 510b results in a corresponding greater positive displacement of the proof masses 504a and 504b. Thus, as is depicted in FIG. 5B, even though an upper surface 522 of each of the anchoring masses 510a and 510b may experience a negative z-direction displacement with respect to the original upper surface of the MEMS layer 520, the proof masses 504a and 504b may remain substantially aligned within the MEMS layer (e.g., form an angle of less than 5% with an original MEMS layer planes).

FIG. 6 shows an illustrative MEMS layer of a MEMS accelerometer having an offset anchor experiencing a vertical compressive force in accordance with some embodiments of the present disclosure. FIG. 6 depicts particular components in a particular configuration and having particular properties. It will be understood by a person having ordinary skill in the art that FIG. 6 may be modified in a variety of manners in accordance with the present disclosure. The components of FIG. 6 are formed within a MEMS device layer and include two parallel MEMS device planes on opposite sides of the MEMS device layer forming parallel x-y planes. Although not depicted in FIG. 6, a substrate layer may be located parallel and below the lower MEMS device plane in the negative z-direction while a cap layer may be located parallel and above to the upper MEMS device plane in the positive z-direction.

In some embodiments, the accelerometer of FIG. 6 may include a first sensor portion 601 and a second sensor portion 603, each of which includes similar or identical components. The first sensor portion and second sensor portion are oriented such that a center of mass associated with the proof mass 602 (i.e., of first sensor portion 601) and proof mass 618 (i.e., of second sensor portion 603) cause anti-phase movement in response to a linear acceleration along the z-axis.

In an embodiment, first sensor portion 601 includes a first anchoring mass 610a and a second anchoring mass 610b. A post 640 may be coupled to the cap layer and to both of the anchoring masses 610a and 610b. Post 640 forms a bonded surface on a positive x-side portion of the upper x-y planar surface of anchoring mass 610a and forms a bonded surface on a negative x-side portion of the upper x-y planar surface of anchoring mass 610b. A first standoff 642a may be coupled to the substrate layer and the anchoring mass 610a, and a second standoff 642b may be coupled to the substrate layer and the anchoring mass 610b. First standoff 642a forms a bonded surface on a negative x-side of the lower x-y planar surface of first anchoring mass 610a. Second standoff 642b forms a bonded surface on a positive x-side of the lower x-y planar surface of second anchoring mass 610b.

In the embodiment of FIG. 6, the post 640 and the standoffs 642a and 642b are substantially offset within the x-y plane, such that a center axis of the post 640 does not pass through either of first standoff 642a or second standoff 642b. A center axis of first standoff 642a does not pass through post 640, and a center axis of second standoff 642b does not pass through post 640 either. First standoff 642a is only bonded to first anchoring mass 610a within the MEMS layer, and second standoff 642b is only bonded to second anchoring mass 610b within the MEMS layer. The anchoring masses 610a and 610b are non-contiguous, and are directly coupled only through the mutual bonding to post 640.

In the exemplary embodiment of FIG. 6, the overlap of the bonding surfaces may be partial (e.g., with less than 25% overlap between the surface associated with the post 640 and the surfaces associated with each of the standoffs 642a and 642b). In additional embodiments, the separation between the bonding surfaces may be greater than that depicted in FIG. 6.

A suspended spring-mass system may be suspended from the anchoring masses 610a and 610b. First anchoring mass 610a may be coupled to proof mass 602 by torsion springs 604 and 616. In the exemplary embodiment of FIG. 6, proof mass 602 may be an asymmetric proof mass. Torsion springs 604 and 616 may be substantially rigid with respect to motion within the x-y plane under normal operating conditions, and may facilitate a rotation about the x-axis the proof mass 602.

In an embodiment, second sensor portion 603 includes a first anchoring mass 626a and a second anchoring mass 626b. A post 650 may be coupled to the cap layer and to both of the anchoring masses 626a and 626b. Post 650 forms a bonded surface on a positive x-side portion of the upper x-y planar surface of anchoring mass 626a and forms a bonded surface on a negative x-side portion of the upper x-y planar surface of anchoring mass 626b. A first standoff 652a may be coupled to the substrate layer and the anchoring mass 626a, and a second standoff 652b may be coupled to the substrate layer and the anchoring mass 626b. First standoff 652a forms a bonded surface on a negative x-side of the lower x-y planar surface of first anchoring mass 626a. Second standoff 652b forms a bonded surface on a positive x-side of the lower x-y planar surface of second anchoring mass 626b.

In the embodiment of FIG. 6, the post 650 and the standoffs 652a and 652b are substantially offset within the x-y plane, such that a center axis of the post 650 does not pass through either of first standoff 652a or second standoff 652b. A center axis of first standoff 652a does not pass through post 650, and a center axis of second standoff 652b does not pass through post 650 either. First standoff 652a is only bonded to first anchoring mass 626a within the MEMS layer, and second standoff 652b is only bonded to second anchoring mass 626b within the MEMS layer. The anchoring masses 626a and 626b are non-contiguous, and are directly coupled only through the mutual bonding to post 650.

In the exemplary embodiment of FIG. 6, the overlap of the bonding surfaces may be partial (e.g., with less than 25% overlap between the surface associated with the post 650 and the surfaces associated with each of the standoffs 652a and 652b). In additional embodiments, the separation between the bonding surfaces may be greater than that depicted in FIG. 6.

A suspended spring-mass system may be suspended from the anchoring masses 626a and 626b. First anchoring mass 626a may be coupled to proof mass 618 by torsion springs 620 and 632. In the exemplary embodiment of FIG. 6, proof mass 618 may be an asymmetric proof mass. Torsion springs 620 and 632 may be substantially rigid with respect to motion within the x-y plane under normal operating conditions, and may facilitate a rotation about the x-axis the proof mass 618.

A linear acceleration in the positive z-direction may cause proof mass 602 to rotate in the negative RX-direction about the rotational axis and may cause proof mass 618 to rotate in the positive RX-direction about its rotational axis (e.g., in the embodiment of FIG. 6 wherein the torsion springs 604, 616, 620, and 632 are aligned along the x-axis, the same rotational axis for both the first sensor portion 601 and second sensor portion 603). The portion of proof mass 602 located to the positive y-direction from the torsion springs 604 and 616 may move towards the substrate and any sense electrodes located below these portions of the proof mass 602. Other portions of proof mass 602 may move away from the substrate and any sense electrodes located below these other portions of the proof mass 602. The portion of proof mass 618 located to the negative y-direction from the torsion springs 620 and 632 may move towards the substrate and any sense electrodes located below these portions of the proof mass 618. Other portions of proof mass 618 may move away from the substrate and any sense electrodes located below these other portions of the proof mass 618.

A linear acceleration in the negative z-direction may cause proof mass 602 to rotate in the positive RX-direction about the rotational axis and may cause proof mass 618 to rotative in the negative RX-direction about its rotational axis. The portion of proof mass 602 located to the positive y-direction from the torsion springs 604 and 616 may move away from the substrate and any sense electrodes located below these portions of the proof mass 602. Other portions of proof mass 602 may move towards the substrate and any sense electrodes located below these other portions of the proof mass 602. The portion of proof mass 618 located to the negative y-direction from the torsion springs 620 and 632 may move away from the substrate and any sense electrodes located below these portions of the proof mass 618. Other portions of proof mass 618 may move towards the substrate and any sense electrodes located below these other portions of the proof mass 618.

In an exemplary embodiment, sense electrodes may be located on a substrate plane below the sense masses to perform differential capacitive sensing based on the rotation of proof masses 602 and 618 about the rotational axis.

In an exemplary embodiment, if the anchors 610a, 610b, 626a and 626b move towards the substrate, the proof masses 602 and 618 may also move toward the substrate as they are coupled to the anchors via torsion springs 604, 616, 620 and 632. If anchors 610a and 626a rotate in positive RY motion and anchors 610b and 626b rotate in negative RY motion, torsion springs 608 and 624 may also rotate in positive RY and torsion springs 612 and 628 may rotate in negative RY. The combined rotation of the torsion springs causes the proof masses 602 and 618 to move away from the substrate.

In an embodiment, the alignment between the post and standoff anchor is designed to cause anchor rotation during a top load force. By designing the post and standoff misalignment the downward motion of the anchor can be counteracted by the upward motion of the anchor angle resulting in a net zero motion of the proof mass and sense gap during the applied force. Thus the downward motion of the anchoring system is balanced with the positive motion caused from the rotation of the anchor.

In the exemplary embodiment of FIG. 6, a downward force is applied to the cap layer. This force is distributed to first anchoring mass 610a and second anchoring mass 610b via post 640, and to first anchoring mass 626a and second anchoring mass 626b via post 650. As is depicted by the "X" in FIG. 6, this causes at least a portion of the anchoring masses 610a, 610b, 626a, and 626b to move closer to the substrate layer. Since the posts 640 and 650 are offset from the standoffs 642a, 642b, 652a and 652b the anchor masses 610a, 610b, 626a, and 626b also rotate. This rotation is applied at the anchor end of the torsion springs 604, 616, 620 and 632 which causes the proof masses 602 and 618 to remain substantially unmoved even though all other components in the device have moved at least partially towards the substrate.

The rotations of the first anchoring mass 610a and second anchoring mass 610b may cause torsion spring 604, 616 and proof mass 602 to move. In an exemplary embodiment, the sizing and relative location of the post 640, the anchoring masses 610a and 610b, and the standoffs 642a and 642b may be such that the springs 604 and 616 are pulled partially out-of-plane while the suspended spring-mass system experiences a countervailing upward push to substantially remain in the original MEMS plane. The rotations of the first anchoring mass 626a and second anchoring mass 626b may cause torsion spring 620 and 632, and proof mass, to move. In an exemplary embodiment, the sizing and relative location of the post 650, the anchoring masses 626a and 626b, and the standoffs 652a and 652b may be such that the springs 620 and 632 are pulled partially out-of-plane while the suspended spring-mass system experiences a countervailing upward push to substantially remain in the original MEMS plane.

The sizing and relative locations of the posts, anchoring masses, and standoffs may be configured in such a way that a greater z-axis force causing a greater displacement of the anchoring masses 610a and 610b results in a corresponding greater positive displacement of the suspended spring-mass system. In this manner, the suspended spring-mass system may substantially remain located substantially stationary within the MEMS device plane despite a wide range of z-axis forces imparted upon the cap layer and posts.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) device, comprising:
an anchor system bonded to a cap layer and bonded to a substrate layer;
a proof mass coupled to the anchor system via a spring;
a sense element coupled between the proof mass and the substrate layer wherein the sense element outputs a signal in response to motion of the proof mass in a first direction;
wherein a force applied to the anchor system causes the anchor system and the spring to move in the first direction, and
wherein the anchor system is configured so that the proof mass remains substantially stationary when the first force is applied to the anchor system.

2. The MEMS device of claim 1, wherein the anchor system is configured to rotate at a connection to the spring when the first force is applied.

3. The MEMS device of claim 2, wherein the movement of the anchor system pushes the proof mass in the negative first direction relative to the anchoring system.

4. The MEMS device of claim 3, wherein the movement of the anchor system in the first direction is balanced with the motion of the proof mass in the negative first direction, resulting in the proof mass remaining substantially stationary.

5. The MEMS device of claim 1, wherein the anchor system comprises an anchor mass coupled to a post, to a standoff, and to the spring, and wherein the post is bonded to the cap layer and the standoff is bonded to the substrate layer.

6. The MEMS device of claim 5, wherein the post and the standoff are misaligned.

7. The MEMS device of claim 6, wherein the post and the standoff do not overlap.

8. The MEMS device of claim 6, wherein the post and the standoff substantially overlap.

9. The MEMS device of claim 6, wherein the misalignment of the post and the standoff cause the anchor mass to translate and rotate when the first force is applied.

10. The MEMS device of claim 9, wherein the combination of the anchor system's translation and rotation causes the proof mass to remain substantially stationary.

11. The MEMS device of claim 5, wherein the post is connected to the top of the anchor mass and the cap layer is above the anchor mass and wherein the standoff is connected to the bottom of the anchor mass and the substrate layer is below the anchor mass.

12. The MEMS device of claim 5, wherein the anchor system further comprises a second anchor mass coupled to the proof mass via a second spring, wherein the second anchor mass is coupled to the post and to a second standoff, and wherein the second standoff is bonded to the substrate.

13. The MEMS device of claim 12, wherein the force applied to the anchor system causes the anchor mass, second anchor mass, the spring, and the second spring to move in the first direction, and wherein the proof mass remains substantially stationary when the first force is applied to the anchor system.

14. The MEMS device of claim 13, wherein the post is misaligned with respect to the standoff and the second standoff, and wherein the anchor mass and second anchor mass rotate when the first force is applied to cause the proof mass to move in the negative first direction.

15. The MEMS device of claim 14, wherein the movement of the anchoring system in the first direction is balanced with the motion of the proof mass in the negative first direction from the rotation of the anchoring system resulting in the proof mass remaining substantially stationary.

16. The MEMS device of claim 1, wherein the MEMS device is an accelerometer, magnetometer, gyroscope, barometer, or microphone.

17. A microelectromechanical (MEMS) device, comprising:
    a cap including a first anchoring system;
    a substrate including a second anchoring system, wherein at least one sense electrode is located on a surface of the substrate; and
    a MEMS layer bonded to each of the cap and the substrate to define a cavity, wherein the MEMS layer comprises a suspended spring-mass system, wherein the suspended spring-mass system comprises:
        at least one movable mass, wherein at least a portion of the at least one movable mass is located at a first distance from to the at least one sense electrode to form at least one sense capacitor; and
        at least one anchoring mass coupled to the at least one movable mass to suspend the at least one movable mass within the MEMS layer, wherein the at least one anchoring mass is coupled to at least a portion of the first anchoring system and at least a portion of the second anchoring system, and wherein the first and second anchoring systems are configured such that in response to a force in a direction perpendicular to the MEMS layer the first anchoring system and the second anchoring system cause the at least one anchoring mass to move in the direction of the force and the at least one movable mass to remains at the first distance from the at least one sense electrode to form the at least one sense capacitor.

18. The MEMS device of claim 17, further comprising:
    a post, wherein the at least one anchoring mass is coupled to the first anchoring system by the post; and
    a standoff, wherein the at least one anchoring mass is coupled to the second anchoring system by the standoff.

19. The MEMS device of claim 18, wherein the post and the standoff are misaligned.

20. A microelectromechanical (MEMS) device, comprising:
    a cap;
    a substrate wherein at least one sense electrode is located on a surface of the substrate;
    a MEMS layer bonded to each of the cap and the substrate to define a cavity, wherein the MEMS layer comprises a suspended spring-mass system;
    at least one post coupled to the cap and one or more anchoring masses of the suspended spring-mass system;
    at least one standoff coupled to the cap and the one or more anchoring masses of the suspended spring mass system,
        wherein the at least one standoff is offset from the at least one post such that the at least one standoff and at least one post do not overlap on opposite faces of the one or more anchoring masses, and
        wherein in response to a force perpendicular to the MEMS layer the one or more anchoring masses move in the direction of the force and at least one proof mass of the spring mass system is substantially stationary.

* * * * *